(12) United States Patent
Kim et al.

(10) Patent No.: US 8,937,711 B2
(45) Date of Patent: Jan. 20, 2015

(54) SENSOR AND METHOD USING THE SAME

(75) Inventors: Suk Pil Kim, Yongin-si (KR); Yoon Dong Park, Yongin-si (KR); Dong Seok Suh, Hwaseong-si (KR); Young Gu Jin, Osan-si (KR); Seung Hoon Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 244 days.

(21) Appl. No.: 13/029,650

(22) Filed: Feb. 17, 2011

(65) Prior Publication Data

US 2011/0199602 A1    Aug. 18, 2011

(30) Foreign Application Priority Data

Feb. 17, 2010   (KR) .................. 10-2010-0014183

(51) Int. Cl.
| | |
|---|---|
| G01C 3/08 | (2006.01) |
| H01L 27/146 | (2006.01) |
| G01B 11/22 | (2006.01) |
| G01S 7/486 | (2006.01) |
| G01S 17/48 | (2006.01) |
| H01L 27/144 | (2006.01) |
| H01L 31/0232 | (2014.01) |
| H01L 31/112 | (2006.01) |

(52) U.S. Cl.
CPC ......... *H01L 27/14607* (2013.01); *G01B 11/22* (2013.01); *G01C 3/08* (2013.01); *G01S 7/4863* (2013.01); *G01S 17/48* (2013.01); *H01L 27/144* (2013.01); *H01L 27/14641* (2013.01); *H01L 31/02327* (2013.01); *H01L 31/112* (2013.01)
USPC ........................................ 356/5.01

(58) Field of Classification Search
USPC ........................................... 356/5.01
See application file for complete search history.

(56) References Cited

U.S. PATENT DOCUMENTS

| | | | |
|---|---|---|---|
| 7,561,198 B2 * | 7/2009 | Sekine ............. | 348/308 |
| 2006/0208163 A1 * | 9/2006 | Manabe et al. ...... | 250/208.1 |
| 2007/0014019 A1 * | 1/2007 | Mouli ............ | 359/619 |
| 2007/0164332 A1 * | 7/2007 | Paik et al. ........ | 257/292 |
| 2008/0036996 A1 * | 2/2008 | O'Connor et al. ..... | 356/5.01 |
| 2009/0046189 A1 * | 2/2009 | Yin et al. ......... | 348/308 |
| 2009/0284731 A1 * | 11/2009 | Jin et al. ......... | 356/4.01 |
| 2010/0073541 A1 * | 3/2010 | Kawahito ......... | 348/311 |

* cited by examiner

*Primary Examiner* — Isam Alsomiri
*Assistant Examiner* — Vicente Rodriguez
(74) *Attorney, Agent, or Firm* — Lee & Morse, P.C.

(57) ABSTRACT

A sensor, including a plurality of photo gate pairs on a semiconductor substrate, each of the photo gate pairs including a first photo gate and a second photo gate, a first shared floating diffusion region in the semiconductor substrate, and a plurality of first transmission transistors on the semiconductor substrate, wherein each of the plurality of first transmission transistors is adapted to transmit charges to the first shared floating diffusion region in response to a first transmission control signal, the charges being generated in the semiconductor substrate under the first photo gate of each of the plurality of photo gate pairs.

19 Claims, 14 Drawing Sheets

SENSOR AND METHOD USING THE SAME

BACKGROUND

1. Field

Embodiments relate to a depth sensor, and more particularly, to a depth sensor increasing a light receiving area and a method using the same.

2. Description of the Related Art

A sensor is a device for detecting a state or location of an object and converting a detection result into an electric signal. A sensor may be classified as a light sensor, a temperature sensor, a pressure sensor, a magnetic sensor or a depth (or distance) sensor.

A depth sensor calculates a distance between a distance sensor and a target object by measuring a delay time taken for a pulse-type signal emitted from a source to be reflected and returned by a target object or an object to be measured. The signal output from the source is generally a microwave, a light wave or an ultrasonic wave, and the depth sensor measures or calculates a distance by using a time of flight (TOF) measurement method.

SUMMARY

It is a feature of an embodiment to provide a depth sensor adapted to increase a light receiving area, and methods of using such a depth sensor.

It is a separate feature of an embodiment to provide a sensor having improved accuracy relative to comparable conventional sensors.

It is a separate feature of an embodiment to provide a sensor having a larger light receiving area of an array, and thus, having improved, i.e., higher, sensitivity relative to comparable conventional sensors.

It is a separate feature of an embodiment to provide a sensor including a micro-lens, so that it may increase an amount of received light.

It is a separate feature of an embodiment to provide a sensor including a photo gate having a reduced length, e.g., along a horizontal direction, and adapted to transmit photo charges to a floating diffusion region rapidly, so that a transmission efficiency of an photo charge may be increased relative to comparable conventional sensors.

It is a separate feature of an embodiment to provide a sensor having a lower capacitance by providing a plurality of photo gates that share a floating diffusion region.

At least one of the above and other features and advantages may be realized by providing a sensor, including a plurality of photo gate pairs on a semiconductor substrate, each of the photo gate pairs including a first photo gate and a second photo gate, a first shared floating diffusion region in the semiconductor substrate, and a plurality of first transmission transistors on the semiconductor substrate, wherein each of the plurality of first transmission transistors is adapted to transmit charges to the first shared floating diffusion region in response to a first transmission control signal, the charges being generated in the semiconductor substrate under the first photo gate of each of the plurality of photo gate pairs.

The sensor may include a plurality of micro-lenses each formed on each of the plurality of photo gate pairs.

The sensor may include a second shared floating diffusion region in the semiconductor substrate, and a plurality of second transmission transistors on the semiconductor substrate, wherein each of the plurality of second transmission transistors transmits charges to the second shared floating diffusion region in response to a second transmission control signal, the charges being generated in the semiconductor substrate under the second photo gate of each of the plurality of photo gate pairs.

The sensor may include a first reset transistor adapted to reset the first shared floating diffusion region in response to a reset signal, and a second reset transistor adapted to reset the second shared floating diffusion region in response to the reset signal.

The sensor may include a first output circuit adapted to output a first electrical signal, generated based on charges transmitted to the first shared floating diffusion region, to a first column line, and a second output circuit adapted to output a second electrical signal, generated based on charges transmitted to the second shared floating diffusion region, to a second column line.

The first output circuit may include a first reset transistor connected between a voltage source and the first shared floating diffusion region, a first driving transistor including a gate connected to the first shared floating diffusion region, and a first selection transistor connected between the first driving transistor and the first column line, wherein the second output circuit may include a second reset transistor connected between the voltage source and the second shared floating diffusion region, a second driving transistor including a gate connected to the second shared floating diffusion region, and a second selection transistor connected between the second driving transistor and the second column line.

The plurality of photo gate pairs may include the first photo gate A and the second photo gate B is (n*m), each photo gate pair may be arranged in each row among the (n*m) photo gate pairs is arranged in an AB type arrangement.

The plurality of photo gate pairs may include the first photo gate A and the second photo gate B is (n*m), every odd numbered photo gate pair arranged in each row among the (n*m) photo gate pairs is arranged in an AB type arrangement and every even numbered photo gate pair arranged in the each row is arranged in a BA type arrangement.

The sensor may be a distance measurement sensor employing a time of flight (TOF) measurement method, the sensor being a CMOS device.

The sensor may further include a light source, a driver adapted to generate a modulated clock signal for driving the light source, and a photo gate controller adapted to supply the modulated clock signal or a first photo gate control signal, having a 90° phase difference from an optical signal output from the light source, to the first photo gate and to supply a second photo gate control signal, having a 180° phase difference from the first photo gate control signal, to the second photo gate.

The sensor may further include a light source, a driver adapted to generate a modulated clock signal for driving the light source, and a photo gate controller adapted to supply the modulated clock signal or a first photo gate control signal, having a same phase as an optical signal output from the light source, to the first photo gate and to supply a second photo gate control signal, having a 180° phase difference from the first photo gate control signal, to the second photo gate.

The photo gate controller may be further adapted to supplying the modulated clock signal or a third photo gate control signal, having a 90° phase difference from the optical signal output from the light source, to the first photo gate and to supply a fourth photo gate control signal, having a 180° phase difference from the third photo gate control signal, to the second photo gate.

At least one of the above and other features and advantages may be separately realized by providing a method of operating a sensor, including supplying a first transmission control signal to a plurality of first transmission transistors formed on a semiconductor substrate and supplying a first photo gate control signal to a first photo gate of each of a plurality of photo gate pairs formed on the semiconductor substrate, and transmitting charges, generated in the semiconductor substrate located under the first photo gate of each of the plurality of photo gate pairs, to a first shared floating diffusion region during a same time.

The method may include supplying optical signals penetrating a plurality of micro-lenses to the plurality of photo gate pairs.

The method may include resetting the first shared floating diffusion region using a reset transistor.

The method may include supplying a second transmission control signal to a plurality of second transmission transistors formed on the semiconductor substrate and supplying a second photo gate control signal to a second photo gate of each of the plurality of photo gate pairs, and transmitting charges, generated in the semiconductor substrate located under the second photo gate of each of the plurality of photo gate pairs, to a second shared floating diffusion region during a same time.

A phase difference between the first photo gate control signal and the second photo gate control signal may be 180°.

The method may include resetting the first shared floating diffusion region using a first reset transistor and resetting the second shared floating diffusion region using a second reset transistor.

At least one of the above and other features and advantages may be separately realized by providing a DEPTH MEASUREMENT DEVICE, INCLUDING a light source, a lens module, a semiconductor device, the semiconductor device including a light source driver, a logic circuit, a row decoder, a photo gate controller, a timing controller, a sensor array, including a plurality of photo gate pairs on a semiconductor substrate, each of the photo gate pairs including a first photo gate and a second photo gate, a first shared floating diffusion region in the semiconductor substrate, and a plurality of first transmission transistors on the semiconductor substrate, wherein each of the plurality of first transmission transistors is adapted to transmit charges to the first shared floating diffusion region in response to a first transmission control signal, the charges being generated in the semiconductor substrate under the first photo gate of each of the plurality of photo gate pairs, wherein the row decoder is adapted to select one of a plurality of rows of the sensor array based a row address output from the timing controller, the photo gate controller is adapted to supply photo gate control signals to the sensor array in accordance with the timing controller, the light source driver adapted to drive the light source in accordance with the timing controller, and the logic circuit is adapted to process signals sensed by the sensor array in accordance with the timing controller.

The lens module may include an infrared pass filter.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
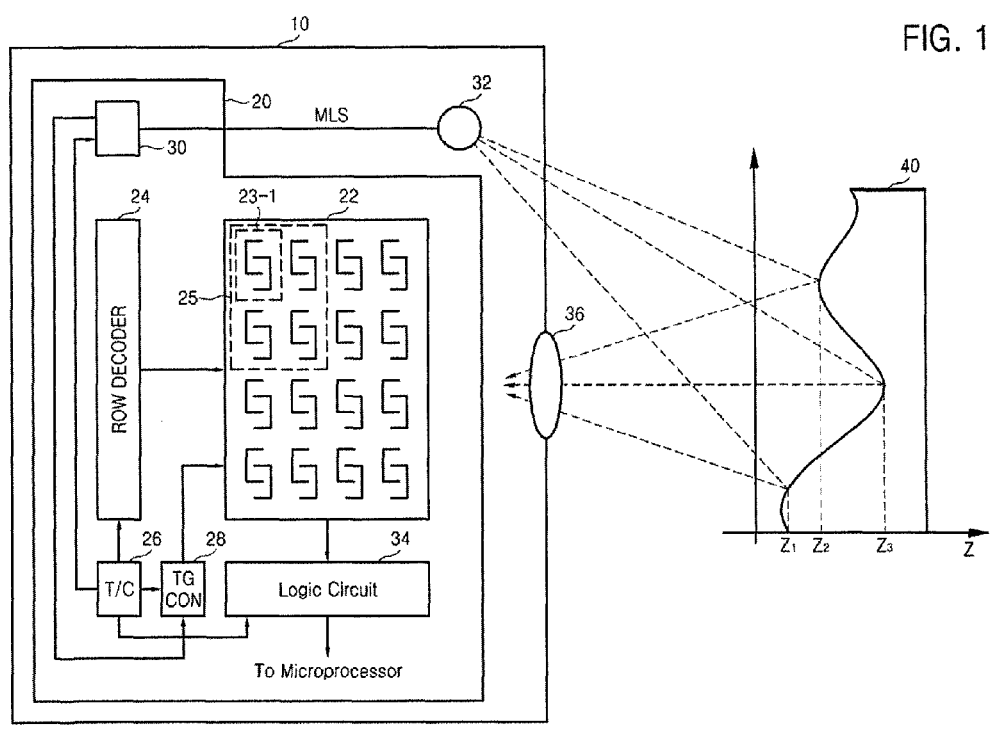
FIG. 1 illustrates a block diagram of a depth measurement device according to an example embodiment of the present invention.

Korean Patent Application No. 10-2010-0014183, filed on Feb. 17, 2010, in the Korean Intellectual Property Office, and entitled: "Sensor and Method Using the Same," is incorporated by reference herein in its entirety.

Detailed exemplary embodiments are disclosed herein. However, specific structural and functional details disclosed herein are merely representative for purposes of describing example embodiments. Embodiments may, however, be embodied in many alternate forms and should not be construed as limited to only the exemplary embodiments set forth herein.

Accordingly, while embodiments are capable of various modifications and alternative forms, exemplary embodiments thereof are shown by way of example in the drawings and will herein be described in detail. It should be understood, however, that there is no intent to limit example embodiments to the particular forms disclosed, but to the contrary, exemplary embodiments are to cover all modifications, equivalents, and alternatives falling within the scope of exemplary embodiments. Like numbers refer to like elements throughout the description of the figures.

Figure 2:
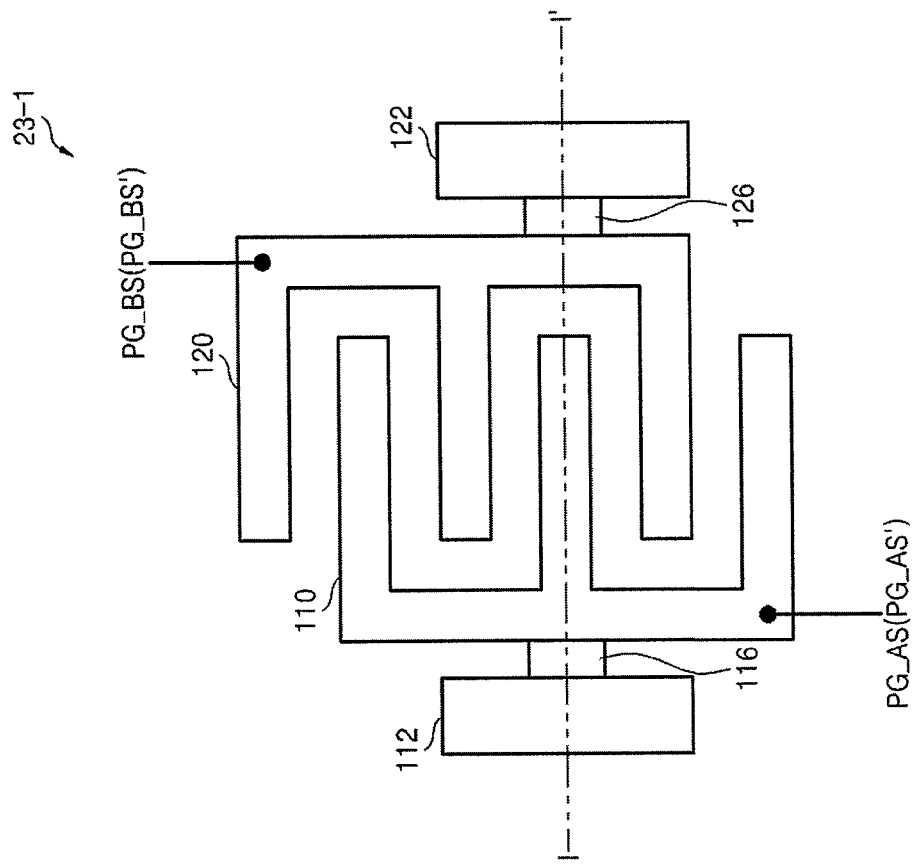
FIG. 2 illustrates a plan view of a pair of sensors illustrated in an array of FIG. 1.
Figure 3:
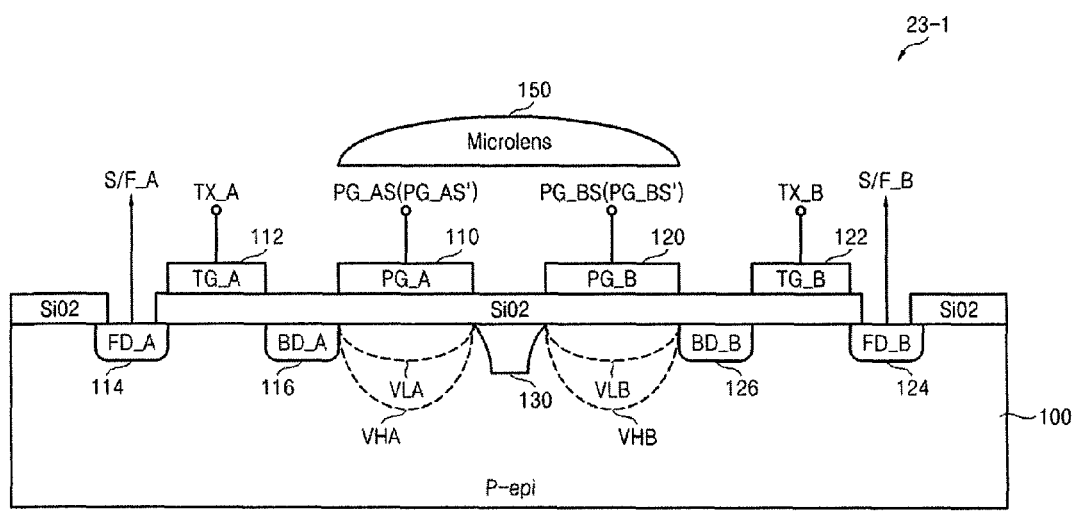
FIG. 3 illustrates a cross-sectional view of the pair of sensors of FIG. 2 along line I-I' of FIG. 2.
Figure 4:
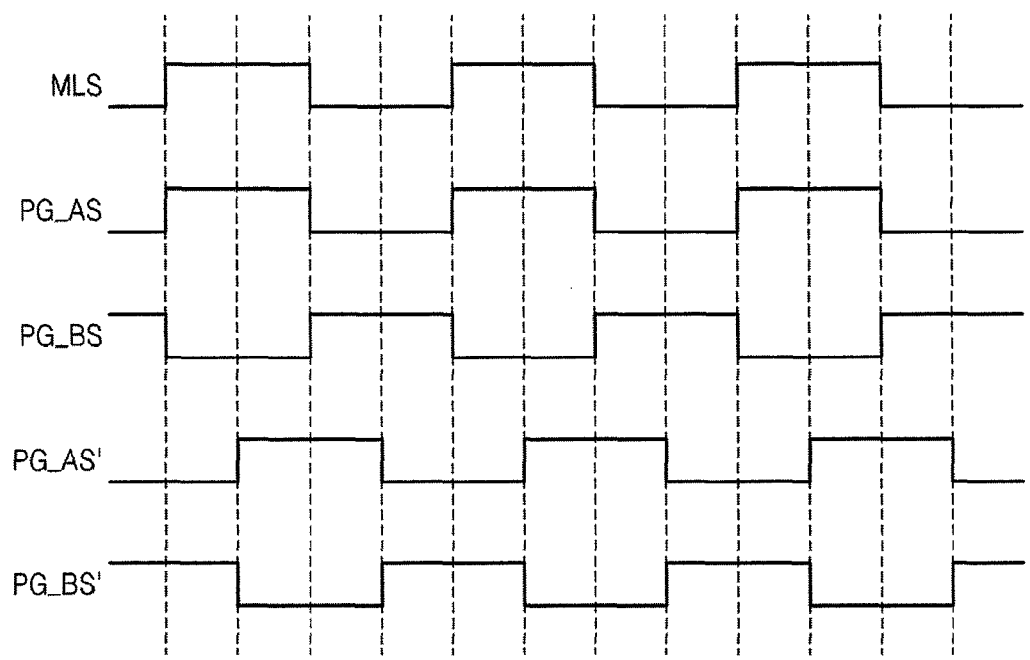
FIG. 4 illustrates a timing diagram of exemplary photo gate control signals employable for controlling photo gates included in the pair of sensors of FIG. 1.

FIG. 1 illustrates a block diagram of a depth measurement device according to an example embodiment of the present invention. FIG. 2 illustrates a plan view of a pair of sensors illustrated in an array of FIG. 1. FIG. 3 illustrates a cross-sectional view of the pair of sensors of FIG. 2 along line I-I' of FIG. 2. FIG. 4 illustrates a timing diagram of exemplary photo gate control signals employable for controlling photo gates included in the pair of sensors of FIG. 1.

Referring to FIGS. 1 to 4, a depth measurement device 10 may measure a depth (or distance) using a time of flight (TOF) method. The depth measurement device 10 may include a semiconductor chip 20, a light source 32, and a lens module 36. The semiconductor chip 20 may include an array 22, a row decoder 24, a timing controller 26, a photo gate controller 28, a light source driver, and a logic circuit 34. The array 22 may include a plurality of sensors (detectors or pixels) 23-1. The plurality of sensors 23-1 may be two-dimensionally arranged in the array 22.

In embodiments, the sensors 23-1 may be arranged in groups, and such groups of the sensors 23-1 may be arranged in the array 22. In embodiments, such grouping of the sensors 23-1 may enable some or all of the sensors 23-1 associated with a same group to share features. Further, e.g., such grouping may enable a light emitting region may be increased. More particularly, e.g., in an exemplary embodiment of FIG. 5, a group 25 of the sensors 23 includes four sensors, e.g., 23-1, 23-2, 23-3, and 23-4.

Referring to FIG. 2, each of the plurality of sensors 23-1 may include a pair of photo gates 110 and 120. In addition, each of the plurality of sensors 23-1 may include a plurality of transistors, e.g., 112, 122, for processing a signal.

The row decoder 24 may select one of a plurality of rows in response to a row address output from the timing controller 26. Here, a row corresponds to an assembly of a plurality of sensors arranged along one direction, e.g., an X-direction, in the array 22.

The photo gate controller 28 may generate a first set of photo gate control signals, e.g., a first photo gate control signal PG_AS and a second photo gate control signal PG_BS. The photo gate controller 28 may supply the first set of photo gate control signals to the array 22 under a control of the timing controller 26.

In embodiments, to improve depth measurement accuracy, the photo gate controller 28 may generate a second set of photo gate control signals, e.g., a third photo gate control signal PG_AS' and a fourth photo gate control signal PG_BS'. The photo gate controller 28 may supply the second set of photo gate control signals to the array 22 under a control of the timing controller 26 after supplying the first set of photo gate control signals PG_AS and PG_BS to the array 22.

In the exemplary embodiment illustrated in FIG. 4, a phase difference between the first photo gate control signal PG_AS and the third photo gate control signal PG_AS' is 90°, a phase difference between the first photo gate control signal PG_AS and the second photo gate control signal PG_BS is 180°, and a phase difference between the first photo gate control signal PG_AS and the fourth photo gate control signal PG_BS' is 270°.

The light source driver 30 may generate a clock signal MLS driving the light source 32 under a control of the timing controller 26.

The light source 32 may emit a modulated optical signal to a target object 40 in response to the clock signal MLS. A light-emitting diode (LED), an organic light emitting diode (OLED) or a laser diode, etc., may be used as the light source 32. For convenience of explanation, it is assumed that a modulated optical signal is the same as a clock signal MLS. The modulated optical signal may be a sinusoidal wave.

The light source driver 30 may supply the clock signal MLS or information of the clock signal MLS to the photo gate controller 28. Accordingly, the photo gate controller 28 may generate the first photo gate control signal PG_AS having the same phase as the clock signal MLS and the second photo gate control signal PG_BS having a 180° phase difference from the clock signal MLS. For example, the photo gate controller 28 and the light source driver 30 may be synchronized with each other.

During a first integration interval, the first photo gate control signal PG_AS may be supplied to a first photo gate 110 and the second photo gate control signal PG_BS may be supplied to a second photo gate 120. In addition, during a second integration interval, the third photo gate control signal PG_AS' may be supplied to the first photo gate 110 and the fourth photo gate control signal PG_BS' may be supplied to the second photo gate 120.

The photo gates 110, 120 may be embodied, e.g., in transparent poly silicon. In embodiments, the photo gates 110, 120 may be embodied, e.g., in Indium tin oxide or tin-doped indium oxide (ITO), Indium Zinc Oxide (IZO) and/or Zinc Oxide (ZnO), etc.

The photo gates 110, 120 may receive light of near infrared range (NIR) wavelengths input through the lens module 36.

The logic circuit 34, under a control of the timing controller 26, may process signals sensed by, e.g., one, some, or all of the sensors 23-1 embodied in the array 22, and may output processed signals to a micro-processor. The micro-processor may calculate a distance based on the processed signals.

In embodiments, the logic circuit 34 may include an analog to digital conversion block converting sense signals output from the array 22 into digital signals. The logic circuit 34 may further include a correlated double sampling (CDS) block for performing CDS on the digital signals output from the analog to digital conversion block.

More particularly, e.g., in some embodiments, the logic circuit 34 may include a CDS block for performing CDS on sense signals, which are output from the array 22, and an analog to digital conversion block for converting signals, which are correlated double sampled by the CDS block, into digital signals.

The logic circuit 34 may further include a column decoder that may output signals of the analog to digital conversion block or the CDS block to a micro-processor under a control of the timing controller 26.

The modulated optical signal output from the light source 32 may be reflected by a target object 40. A distance Z from the light source 32 and/or the array 22 to the target object 40 may be calculated as follows when, e.g., respective portions of the target object 40 are at different distances, e.g., Z1, Z2, Z3.

For example, when the modulated optical signal S1 is cosωt and an optical signal S2 incident to a sensor 23-1 or an optical signal S2 detected by the sensor 23-1 is cos(ωt+φ), a phase shift φ by TOF (time of flight) is as follows.

$$\phi = 2*\omega*Z/C = 2*(2\pi f)*Z/C$$

Here, C is a light speed.

Accordingly, a distance Z from the light source 32 and/or the array 22 to the target object 40 may be calculated as follows.

$$Z = \phi*C/(2*\omega) = \phi*C/(2*(2\pi f))$$

Reflected optical signals are incident to the array 22 through the lens module 36. Here, the lens module 36 may include, e.g., a lens and an infrared pass filter.

While the single light source 32 is illustrated in FIG. 1, embodiments are not limited thereto. That is, embodiments may include the single light source 332 having a different arrangement and/or a plurality of light sources in a plurality of different arrangements. For example, the depth measurement device 10 may include a plurality of light sources arranged, e.g., in a circle around the lens module 36.

Optical signals incident to the array 22 through the lens module 36 may be demodulated by the plurality of sensors 23-1. That is, optical signals incident to the array 22 through the lens module 36 may form an image.

Referring to FIG. 2, a first floating diffusion region 114 and a second floating diffusion region 124 may be formed in a P type substrate 100.

The first floating diffusion region 114 may be connected to a gate of a first driving transistor S/F_A (not shown). The second floating diffusion region 124 may be connected to a gate of a second driving transistor S/F_B (not shown). Each driving transistor S/F_A and S/F_B may function as a source follower. Each floating diffusion region 114, 124 may be doped, e.g., with N-type impurities (or dopants).

The silicon dioxide ($SiO_2$) film may be formed on the P-type substrate 100. The photo gates 110, 120 and the transmission transistors 112, 122 may be formed on the silicon dioxide ($SiO_2$) film. The isolation region 130 may be formed inside the P type substrate 100. The isolation region 130 may isolate charges, which may be generated in the P type substrate 100 by each photo gate 110, 120, so as to keep them from affecting each other.

The P type substrate 100 may be, e.g., a P-type doped epitaxial substrate.

The isolation region 130 may be a P+ doped region. In embodiments, the isolation region 130 may be embodied in a shallow trench isolation (STI) method, a local oxidation of silicon (LOCOS) method, etc.

During a first integration interval, the first photo gate control signal PG_AS may be supplied to the first photo gate 110 and the second photo gate control signal PG_BS may be supplied to the second photo gate 120. Photo charges (or photo electronics) may be generated in the P type substrate 100 below each of the photo gates 110, 120.

A first transmission control signal TX_A for transmitting photo charges (or photo electronics) from below the first photo gate 110 to the first floating diffusion region 114 may be supplied to a gate of a first transmission transistor 112. In addition, a second transmission control signal TX_B for transmitting photo charges from below the second photo gate 120 to the second floating diffusion region 124 may be supplied to a gate of a second transmission transistor 122.

In embodiments, a first bridging diffusion region 116 may be formed within the P type substrate 100 between the first photo gate 110 and the first transmission transistor 112. That is, e.g., the first bridging diffusion region 116 may correspond to a portion of the P type substrate 100 between respective portions of the P type substrate 100 below the first photo gate 110 and the first transmission transistor 112. A second bridging diffusion region 126 may be formed within the P type substrate 100 between the second photo gate 120 and the second transmission transistor 122. That is, e.g., the second bridging diffusion region 126 may correspond to a portion of the P type substrate 100 between respective portions of the P type substrate 100 below the second photo gate 120 and the second transmission transistor 122. Each of the bridging diffusion regions 116, 126 may be doped with N type impurities (or dopants).

Photo charges may be generated by optical signals incident on the P type substrate 100 through the photo gates 110, 120.

When a first transmission control signal TX_A having a first level, e.g., 1.0V, is supplied to the gate of the first transmission transistor 112 and a first photo gate control signal PG_AS having a high level, e.g., 3.3V, is supplied to the first photo gate 110, photo charges generated inside the P type substrate 100 may gather below the first photo gate 110 before being transmitted to the first floating diffusion region 114. More particularly, e.g., in embodiments that do not include the first bridging diffusion region 116, photo charges gathered below the first photo gate 110 may be transmitted to the first floating diffusion region 114. In embodiments including the first bridging diffusion region 116 is not formed, photo charges gathered below the first photo gate 110 may be transmitted to the first floating diffusion region 114 through the first bridging diffusion region 116.

When a second transmission control signal TX_B having a first level, e.g., 1.0V, is supplied to the gate of the second transmission transistor 122 and a second photo gate control signal PG_BS having a low level, e.g., 0V, is supplied to the second photo gate 120, photo charges may be generated inside the P type substrate 100 below the second photo gate 120. However, such generated photo charges may not be transmitted to the second floating diffusion region 124.

Referring to FIG. 3, VHA represents a potential or a region where photo charges may accumulate when a first photo gate control signal PG_AS having a high level is supplied to the first photo gate 110. VLB represents a potential or a region where photo charges may accumulate when a second photo gate control signal PG_BS having a low level is supplied to the second photo gate 120.

Moreover, e.g., when a first transmission control signal TX_A having a first level, e.g., 1.0V, is supplied to the gate of the first transmission transistor 112 and a first photo gate control signal PG_AS having a low level, e.g., 0V, is supplied to the first photo gate 110, photo charges may be generated inside the P type substrate 100 below the first photo gate 110. However, under such conditions, such charges may not be transmitted to the first floating diffusion region 114.

Further, when a second transmission control signal TX_B having a first level, e.g., 1.0V, is supplied to the gate of the second transmission transistor 122 and a second photo gate control signal PG_BS having a high level, e.g., 3.3V, is supplied to the second photo gate 120, photo charges generated inside the P type substrate 100 may accumulate below the second photo gate 120 and such photo charges may be transmitted to the second floating diffusion region 124. More particularly, e.g., in embodiments that do not include the second bridging diffusion region 126, photo charges gathered below the second photo gate 120 may be transmitted to the second floating diffusion region 124. In embodiments including the second bridging diffusion region 126 is not formed, photo charges gathered below the second photo gate 120 may be transmitted to the second floating diffusion region 124 through the second bridging diffusion region 126.

Referring to FIG. 3, VHB represents a potential or a region where photo charges may accumulate when a second photo gate control signal PG_BS having a high level is supplied to the second photo gate 120. VLA represents a potential or a region where photo charges may accumulate when a first photo gate control signal PG_AS having a low level is supplied to the first photo gate 110.

A charge collection operation and a charge transmission operation when, e.g., a third photo gate control signal PG_AS' is supplied to the first photo gate 110 may be similar to the charge collection operation and the charge transmission operation when a first photo gate control signal PG_AS is supplied to the first photo gate 110.

A charge collection operation and the charge transmission operation when, e.g., a fourth photo gate control signal PG_BS' is supplied to the second photo gate 120 may be similar to the charge collection operation and the charge transmission operation when a second photo gate control signal PG_BS is supplied to the second photo gate 120.

Referring to FIG. 3, the sensor 23-1 may include a micro-lens 150 over the photo gates 110, 120. Embodiments are not, however, limited to including such a micro-lens 150. That is, e.g., embodiments may not include the micro-lens 150.

Figure 5:
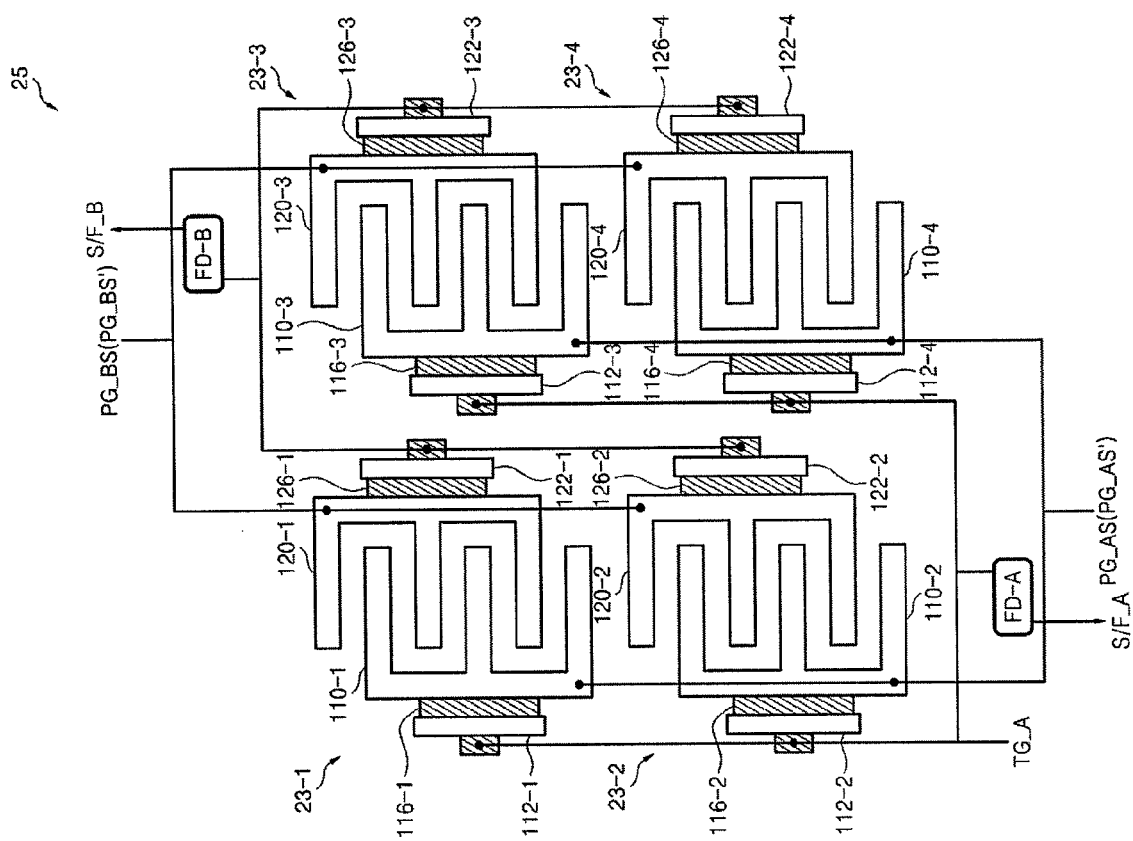
FIG. 5 illustrates a plan view of an exemplary arrangement of a plurality of sensors according to an exemplary embodiment.
Figure 6:
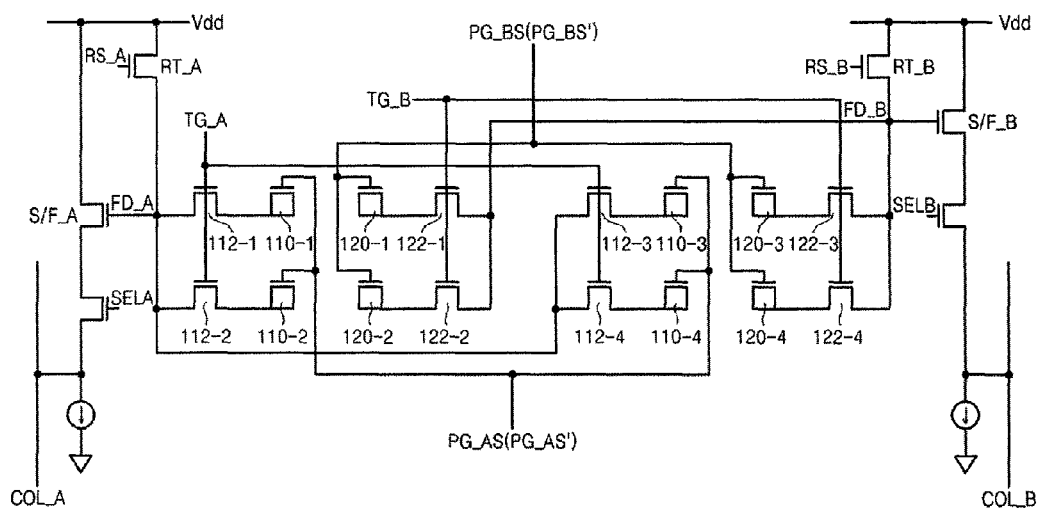
FIG. 6 illustrates a circuit diagram including the plurality of sensors illustrated in FIG. 5.

FIG. 5 illustrates a plan view of an exemplary arrangement of the group 25 of sensors 23 according to an exemplary embodiment. FIG. 6 illustrates a circuit diagram including the plurality of sensors 23 illustrated in FIG. 5. More particularly, in the exemplary embodiment of FIG. 5, the group 25 of sensors 23 may include four sensors 23-1, 23-2, 23-3, 23-4, corresponding, e.g., to four pairs of photo gates (110-1, 120-1), (110-2, 120-2), (110-3, 120-3), (110-4, 120-4).

In embodiments, (n*m) photo gate pairs may be embodied in the array 22 and each of the (n*m) photo gate pairs may include a first photo gate A, e.g., 110, and a second photo gate B, e.g., 120. Each photo gate pair arranged in each row among the (n*m) photo gate pairs may be repeatedly arranged in an AB type arrangement. Here, n and m are natural numbers, and n may be equal to m or not equal to m. In the exemplary embodiment of FIG. 5, 2*2 photo gate pairs are illustrated in an exemplary arrangement. Embodiments are not, however, limited thereto.

Referring to FIGS. 1, 4, 5, and 6, each of the sensors 23-1, 23-2, 23-3, 23-4 may respectively include a first photo gate 110-1, 110-2, 110-3, 110-4 and a second photo gate 120-1, 120-2, 120-3, 120-4.

Each of the first photo gates 110-1, 110-2, 110-3, 110-4 may be electrically connected to each other. That is, e.g., each of the first photo gates 110-1, 110-2, 110-3, 110-4 of the group 25 may be electrically connected to each other. Each of the first photo gates 110-1, 110-2, 110-3, 110-4 may share a first floating diffusion region FD_A. More particularly, e.g., the first photo gate control signal PG_AS or the third photo gate control signal PG_AS' may be supplied to each first photo gate 110-1, 110-2, 110-3 and 110-4.

Referring to FIGS. 5 and 6, gates of each first transmission transistor 112-1, 112-2, 112-3, 112-4 of the group 25 may be electrically connected to each other. In such embodiments, gates of the first transmission transistors 112-1, 112-2, 112-3, 112-4 may operate in response to a first transmission control signal TG_A.

Referring to FIG. 6, a gate of the first driving transistor S/F_A may be connected to a first floating diffusion region FD_A. A first reset transistor RT_A may reset the first floating diffusion region FD_A in response to a first reset signal RS_A. The first reset transistor RT_A may be connected between a voltage source Vdd and the first floating diffusion region FD_A.

The first driving transistor S/F_A and a first selection transistor may be connected in series between the voltage source Vdd and a first column line COL_A. The first selection transistor may transmit a signal driven by the first driving transistor S/F_A to the first column line COL_A in response to a first selection signal SELA output from the row decoder 24 (see, FIG. 1).

Referring to FIGS. 5 and 6, each of second photo gates 120-1, 120-2, 120-3, 120-4 may be electrically connected to each other. That is, e.g., each of the second photo gates 120-1, 120-2, 120-3, 120-4 of the group 25 may be electrically connected to each other. Each of the second photo gates 120-1, 120-2, 120-3, 120-4 of the group 25 may share a second floating diffusion region FD_B. Accordingly, e.g., the second photo gate control signal PG_BS or the fourth photo gate control signal PG_BS' may be supplied to each of the second photo gate 120-1, 120-2, 120-3, 120-4 of the group 25.

A gate of each second transmission transistor 122-1, 122-2, 122-3, 122-4 corresponding to the group 25 may be electrically connected to each other. The second transmission transistors 122-1, 122-2, 122-3, 122-4 may operate in response to a second transmission control signal TG_B.

The gate of the second driving transistor S/F_B may be connected to the second floating diffusion region FD_B. A second reset transistor RT_B may reset the second floating diffusion region FD_B in response to a second reset signal RS_B. The second reset transistor RT_B may be connected between the voltage source Vdd and the second floating diffusion region FD_B.

The second driving transistor S/F_B and a second selection transistor may be connected to each other in series between the voltage source Vdd and a second column line COL_B. The second selection transistor may transmit a signal driven by the second driving transistor S/F_B to the second column line COL_B in response to a second selection signal SELB output from the row decoder 24 (see, FIG. 1).

In embodiments, first bridging diffusion regions 116-1, 116-2, 116-3, 116-4 may be formed between corresponding ones of the first photo gates 110-1, 110-2, 110-3, 110-4 and the first transmission transistors 112-1, 112-2, 112-3, 112-4. In embodiments, second bridging diffusion regions 126-1, 126-2, 126-3, 126-4 may be formed between corresponding ones of the second photo gates 120-1, 120-2, 120-3, 120-4 and the second transmission transistors 122-1, 122-2, 122-3, 122-4.

In embodiments, a plurality, e.g., all, of the first photo gates 110-1, 110-2, 110-3, 110-4 of the group 25 may share the first floating diffusion region FD_A. In such embodiments, charges, which are transmitted to the first floating diffusion region FD_A by the first photo gates 110-1, 110-2, 110-3, 110-4 of the group 25, may be transmitted to the first column line COL_A by a first output circuit. Thus, the array 20 including an arrangement of sensors 23-1, 23-2, 23-3, 23-4 according to such an More particularly, exemplary arrangements described herein may reduce an overhead area of the array 22 as a result of connections, etc., by, e.g., enabling corresponding ones of the photo gates to share floating diffusion regions.

More particularly, in embodiments, the first output circuit may include the first reset transistor RT_A, the first driving transistor S/F_A, and the first selection transistor operating in response to the first selection signal SELA.

In embodiments, a plurality, e.g., all, of the second photo gates 120-1, 120-2, 120-3, 120-4 of the group 25 may share the second floating diffusion region FD_B. In such embodiments, charges, which are transmitted to the second floating diffusion region FD_B by the second photo gates 120-1, 120-2, 120-3, 120-4 of the group 25, may be transmitted to the second column line COL_B by a second output circuit. Thus, the array 20 including an arrangement of sensors 23-1, 23-2, 23-3, 23-4 according to such an exemplary embodiment may enable a size of the array 22 to be reduced. More particularly, exemplary arrangements described herein may reduce an overhead area of the array 22 as a result of connections, etc., by, e.g., enabling corresponding ones of the photo gates to share floating diffusion regions.

More particularly, in embodiments, the second output circuit may include the second reset transistor RT_B, the second driving transistor S/F_B, and the second selection transistor operating in response to a second selection signal SELB.

Figure 7:
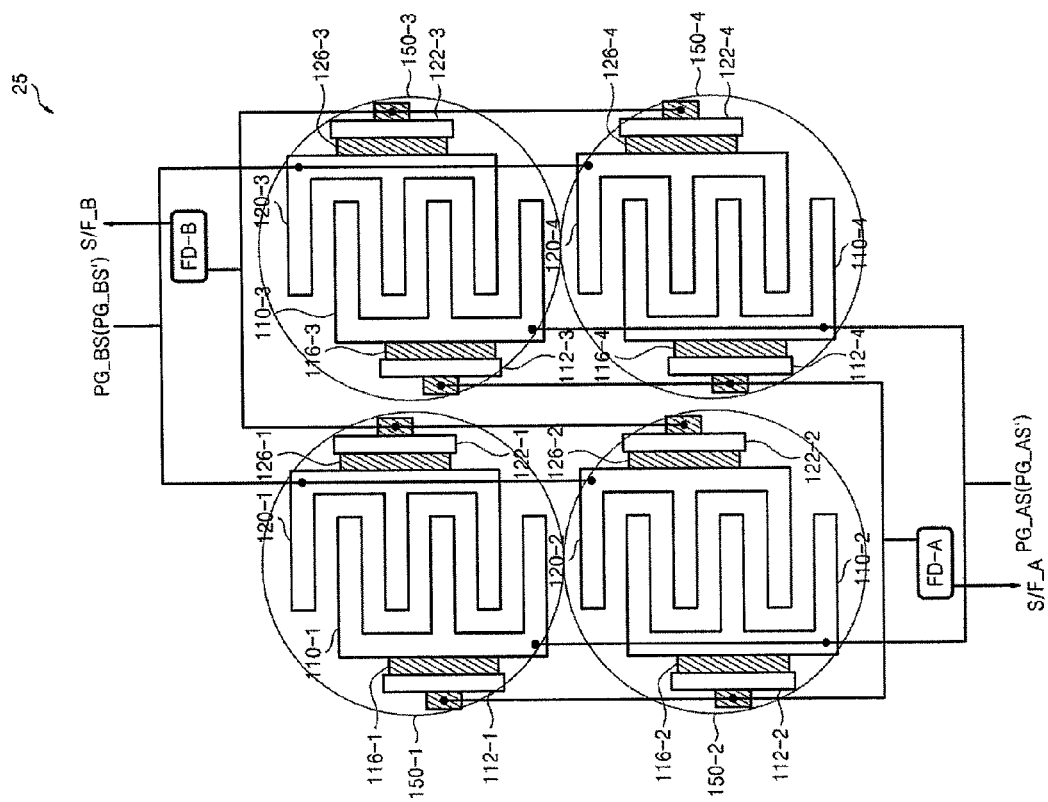
FIG. 7 illustrates a plan view of the exemplary arrangement of sensors illustrated in FIG. 5, further including a plurality of micro-lenses.

FIG. 7 illustrates a plan view of the exemplary arrangement of sensors illustrated in FIG. 5, further including a plurality of micro-lenses. In general, only differences between the exemplary embodiment of FIG. 7 and the exemplary embodiment of FIG. 5 will be described below. In the exemplary embodiment of FIG. 7, a plurality of micro-lenses 150-1, 150-2, 150-3, 150-4 may be provided. More particularly, a respective one of the micro-lenses 150-1, 150-2, 150-3, 150-4 may be provided for each of the sensors 23-1, 23-2, 23-3, 23-4 of the group 25. By providing such micro-lenses 150-1, 150-2, 150-3, 150-4, an amount of received light or a light receiving area of an array, e.g., 22, may be increased. That is, e.g., an arrangement of the array 22 according to features described herein may increase a size of an area where optical signals incident through a lens module 36 may be sensed.

In embodiments, as a result of such grouping, a horizontal length, i.e., a finger, of each of the photo gates 110, 120 may be shortened. Thus, referring to FIGS. 5 and 7, e.g., a transmission time for transmitting photo charges generated by optical signals to each floating diffusion region, e.g., FD_A and FD_B, may be considerably reduced. Further, by providing such micro-lenses 150-1, 150-2, 150-3, 150-4, an amount of received light or a light receiving area of an array, e.g., 22, may be increased.

Figure 8:
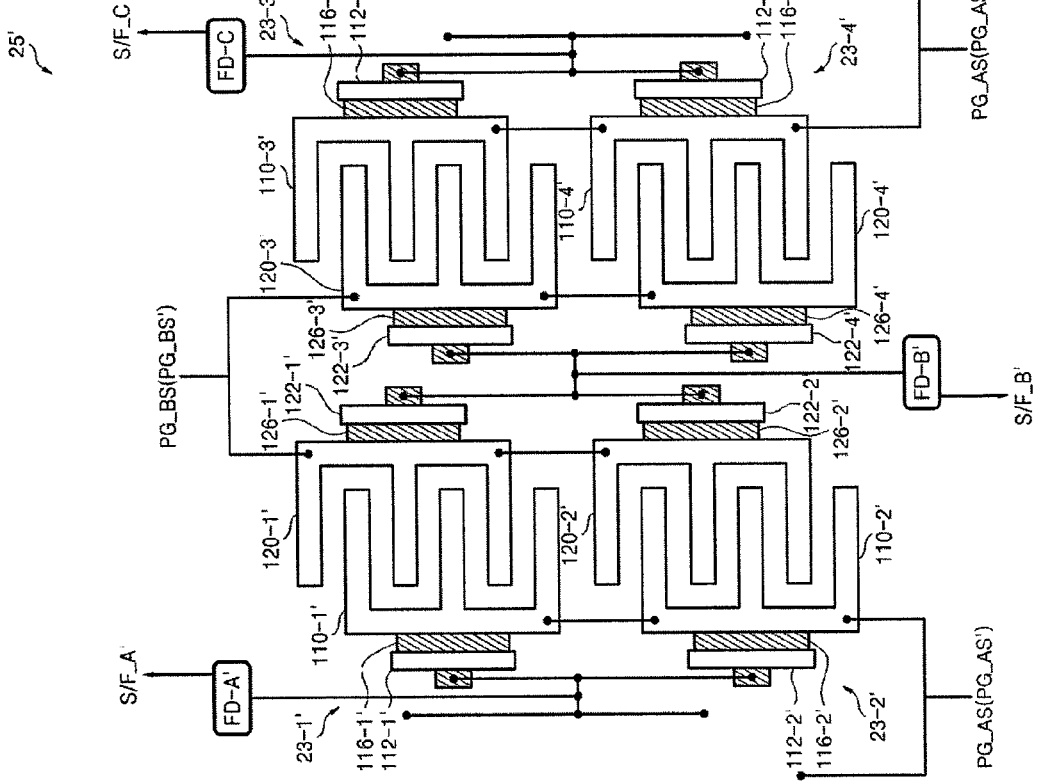
FIG. 8 illustrates a plan view of an exemplary arrangement of a plurality of sensors according to another exemplary embodiment.
Figure 9:
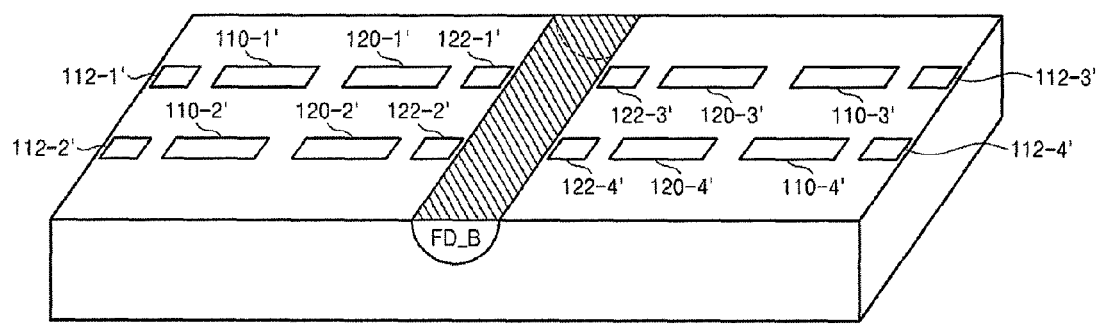
FIG. 9 illustrates a perspective view of an array including the plurality of sensors illustrated in FIG. 8.
Figure 10:
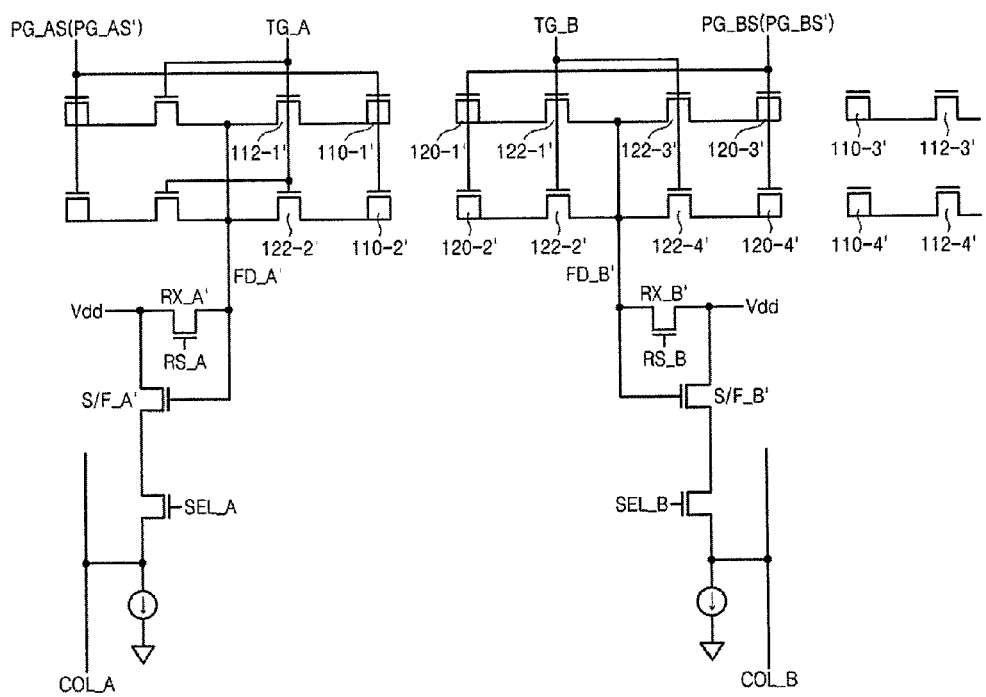
FIG. 10 illustrates a circuit diagram including the plurality of sensors illustrated in FIG. 8.

FIG. 8 illustrates a plan view of an exemplary arrangement of a plurality of sensors according to another exemplary embodiment. FIG. 9 illustrates a perspective view of an array including the plurality of sensors illustrated in FIG. 8. FIG. 10 illustrates a circuit diagram including the plurality of sensors illustrated in FIG. 8. In general, only differences between the exemplary embodiment of FIGS. 8-10 and the exemplary embodiment of FIG. 5 will be described.

In embodiments, n*m photo gate pairs may be arranged in the array 22. Each of the n*m photo gate pairs may include a first photo gate A and a second photo gate B. More particularly, e.g., an odd numbered photo gate pair arranged in each row among the n*m photo gate pairs may be arranged in an AB type configuration, and an even numbered photo gate pair arranged in each row may be arranged in a BA type configuration. That is, e.g., referring to FIG. 8, in an upper row including the sensor 23-1' and the sensor 23-3', an arrangement of the first photo gate 110-1' and the second photo gate 120-1' within the sensor 23', e.g., odd photo gate pair (110-1', 120-1') is reversed relative an arrangement of the first photo gate 110-3' and the second photo gate 120-3' within the sensor 23-3', e.g., even photo gate pair (110-3', 120-3'). Here, n and m are natural numbers, and n may or may not equal m.

Referring to FIGS. 1, 3, 8, 9 and 10, each of the plurality of sensors 23-1', 23-2', 23-3', 23-4' may respectively include a first photo gate 110-1', 110-2', 110-3', 110-4' and a second photo gate 120-1', 120-2', 120-3', 120-4'.

Respective ones of the first photo gates arranged on a same respective side of a column may be electrically connected to each other. That is, e.g., within the array 22, the arrangement of the sensors 23-1', 23-2' may correspond to a column, as may the arrangement of the sensors 23-3', 23-4'.

The first photo gates 110-1', 110-2' may be electrically connected to each other. The first photo gates 110-1', 110-2' may share a first floating diffusion region FD_A'. The first photo gates 110-3', 110-4' may be electrically connected to each other. The first photo gates 110-3', 110-4' may share a third floating diffusion region FD_C. In such embodiments, the first photo gate control signal PG_AS or the third photo gate control signal PG_AS' may be supplied to each of the first photo gate 110-1', 110-2', 110-3', 110-4'.

Gates of first transmission transistors 112-1', 112-2' may be electrically connected to each other. The first transmission transistors 112-1', 112-2' may operate in response to a first transmission control signal TG_A.

A gate of a first driving transistor S/F_A' may be connected to the first floating diffusion region FD_A'. A first reset transistor RX_A' may reset the first floating diffusion region FD_A' in response to a first reset signal RS_A. The first reset transistor RX_A' may be connected between the voltage source Vdd and the first floating diffusion region FD_A'.

The first driving transistor S/F_A' and a first selection transistor may be connected to each other between the voltage source Vdd and a first column line COL_A. The first selection transistor may transmit a signal driven by the first driving transistor S/F_A to the first column line COL_A in response to a first selection signal SEL_A output from the row decoder 24.

The second photo gates 120-1', 120-2', 120-3', 120-4' may be electrically connected to each other. The second photo gates 120-1', 120-2', 120-3', 120-4' may share a second floating diffusion region FD_B'. In such embodiments, the second photo gate control signal PG_BS or the fourth photo gate control signal PG_BS' may be supplied to each of the second photo gate 120-1', 120-2', 120-3', 120-4'.

Gates of the second transmission transistors 122-1', 122-2', 122-3', 122-4' may be electrically connected to each other, and may operate in response to a second transmission control signal TG_B.

A gate of a second driving transistor S/F_B' may be connected to a second floating diffusion region FD_B'. A second reset transistor RX_B' may reset the second floating diffusion region FD_B' in response to a second reset signal RS_B. The second reset transistor RX_B' may be connected between the voltage source Vdd and the second floating diffusion region FD_B'.

The second driving transistor S/F_B' and a second selection transistor may be connected in series between the voltage source Vdd and the second column line COL_B. The second selection transistor may transmit a signal driven by the second driving transistor S/F_B to the second column line COL_B in response to a second selection signal SEL_B output from the row decoder 24.

In some embodiments, first bridging diffusion regions 116-1', 116-2', 116-3', 116-4' may be further formed between corresponding ones of the first photo gates 110-1', 110-2', 110-3', 110-4' and the first transmission transistors 112-1', 112-2', 112-3', 112-4'. Moreover, in some embodiments, second bridging diffusion regions 126-1', 126-2', 126-3', 126-4' may be formed between each of the second photo gates 120-1', 120-2', 120-3', 120-4' and each of the second transmission transistors 122-1', 122-2', 122-3', 122-4'.

Referring to FIG. 10, a plurality of the first photo gates, e.g., 110-1', 110-2', may share the first floating diffusion region FD_A'. Charges, which may be transmitted to the first floating diffusion region FD_A' by each of the first photo gates, e.g., 110-1', 110-2', may be transmitted to the first column line COLA by a first output circuit. Embodiments of an array including such an exemplary arrangement of sensors, e.g., 23' adapted to, e.g., share a floating diffusion region, e.g., FD_A', may have a smaller area relative to comparable conventional devices.

The first output circuit may include the first reset transistor RX_A', the first driving transistor S/F_A', and the first selection transistor that may operate in response to a first selection signal SEL_A.

Further, referring to FIG. 10, first photo gates 110-3', 110-4' may share a floating diffusion region FD_C. More particularly, the first photo gates 110-3', 110-4' may have features similar to the first photo gates 110-1', 110-2', and the floating diffusion region FD_C may have features similar to the floating diffusion region FD_A'.

In embodiments, a plurality of the second photo gates, e.g., 120-1', 120-2', 120-3', 12-4', may share the second floating diffusion region FD_B'. Charges, which may be transmitted to the second floating diffusion region FD_B' by each of the second photo gates 120-1', 120-2', 120-3', 12-4', may be transmitted to the second column line COL_B by a second output circuit. Embodiments of an array including such an exemplary arrangement of sensor, e.g., 23' adapted to, e.g., share a floating diffusion region, e.g., FD_B', may have a smaller area relative to comparable conventional devices.

The second output circuit may include the second reset transistor RX_B', the second driving transistor S/F_B', and the second selection transistor that may operate in response to a second selection signal SEL_B.

Embodiments of an array, e.g., 22, including one or more features described herein may decrease an area of the array. Embodiments of an array, e.g., 22, including one or more features described herein may increase an area where optical signals incident through the lens module 36 may be sensed.

Figure 11:
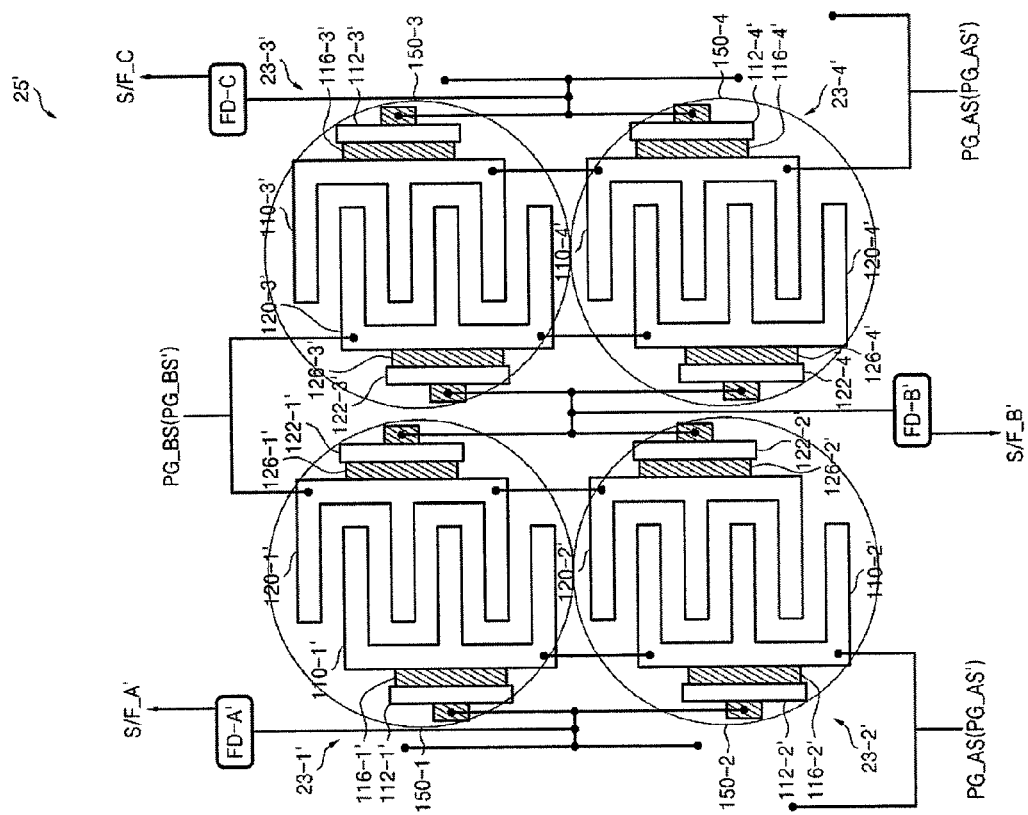
FIG. 11 illustrates a plan view of the exemplary arrangement of sensors illustrated in FIG. 8, further including a plurality of micro-lenses.

FIG. 11 illustrates a plan view of the exemplary arrangement of the sensors 23' of FIG. 8, further including the plurality of micro-lenses 150-1, 150-2, 150-3 and 150-4.

In general, only differences between the exemplary embodiment of FIG. 8 and the exemplary embodiment of FIG. 11 will be described below. In the exemplary embodiment of FIG. 11, a plurality of micro-lenses 150-1, 150-2, 150-3, 150-4 may be provided. More particularly, a respective one of the micro-lenses 150-1, 150-2, 150-3, 150-4 may be provided for each of the sensors 23-1', 23-2', 23-3', 23-4' of the group 25'. By providing such micro-lenses 150-1, 150-2, 150-3, 150-4, an amount of received light or a light receiving area of the array 22 may be increased.

By enabling some or all of the first photo gates, e.g., 110-1', 110-2', to share a floating diffusion region, e.g., FD_A', an array including such an exemplary arrangement of sensors, e.g., 23' adapted to, e.g., share a floating diffusion region, e.g., FD_A', may have a smaller area relative to comparable conventional devices.

Further, in embodiments, a horizontal length, e.g., finger, of one, some, or all of the first photo gates, e.g., 110-1', 110-2', 110-3', 110-4', and/or one, some, or all of the second photo gates, e.g., 120-1', 120-2', 120-3', 120-4', may be shortened relative to comparable conventional arrangements, and a transmission time for transmitting photo charges generated by optical signals to the respective floating diffusion region, e.g., FD_A', FD_B', FD_C, may be dramatically reduced.

Further, in embodiments, by providing such micro-lenses 150-1, 150-2, 150-3, 150-4, an amount of received light or a light receiving area of an array, e.g., 22, may be increased.

Figure 12:
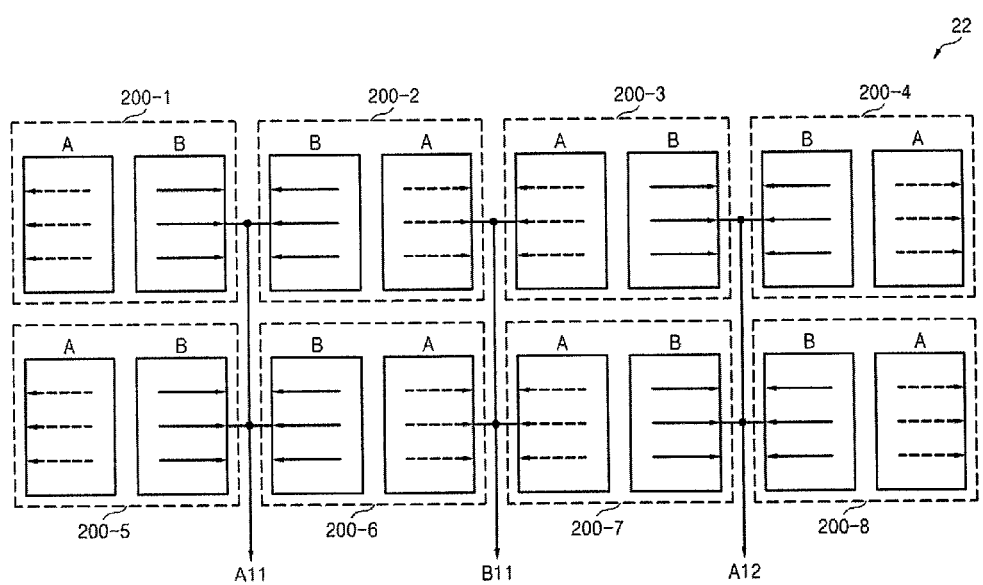
FIG. 12 illustrates a signal flow diagram for explaining an exemplary operation of the plurality of sensors illustrated in FIG. 8.
Figure 13:
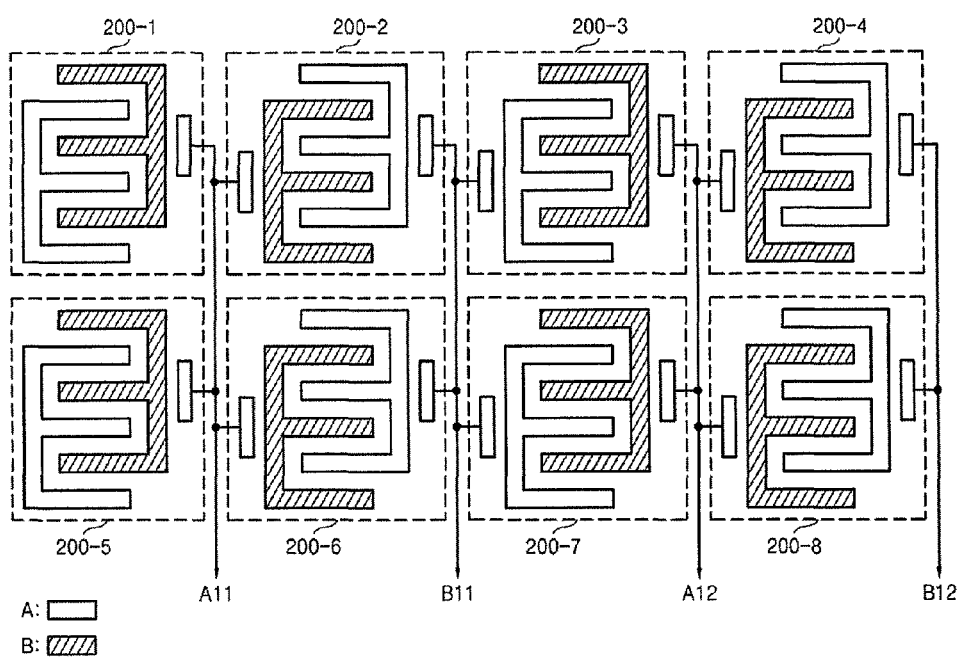
FIG. 13 illustrates a detailed diagram of the plurality of sensors illustrated in FIG. 12.

FIG. 12 illustrates a signal flow diagram for explaining an exemplary operation of a plurality of sensors 200-1, 200-2, 200-3, 200-4, 200-5, 200-6, 200-7, 200-8. The sensors 200-1 to 200-8 may respectively correspond to the sensors 23-1' 23-4' of FIG. 8 arranged in a repeated pattern. FIG. 13 illustrates a detailed diagram of the plurality of sensors 200-1 to 200-8 illustrated in FIG. 12.

Referring to FIGS. 1, 8, 11, 12, 13, the array 22 may include the plurality of sensors 200-1 to 200-8. Each of the plurality of sensors 200-1 to 200-8 may include a first photo gate A and a second photo gate B. Although not illustrated, in embodiments, a micro-lens may be provided for each of the sensors 200-1 to 200-8.

The first photo gate control signal PG_BS may be supplied to the first photo gate A of each of the plurality of sensors 200-1 to 200-8 at a same as the second photo gate control signal PG_BS may be supplied to the second photo gate A of each of the plurality of sensors 200-1 to 200-8.

More particularly, e.g., when the first photo gate control signal PG_AS having a high level is supplied to each of the first photo gates A of the plurality of sensors 200-2 and 200-3, first signals generated by each of the plurality of sensors 200-2 and 200-3 may be output through a first data line B11.

Afterwards, when a second photo gate control signal PG_BS having a high level is supplied to each of the second photo gates B of a plurality of sensors 200-1, 200-2, 200-3 and 200-4, second signals generated by each of a plurality of sensors 200-1 and 200-2 may be output through a second data line A11, and third signals generated by each of a plurality of sensors 200-3 and 200-4 may be output through a third data line A12.

Figure 14:
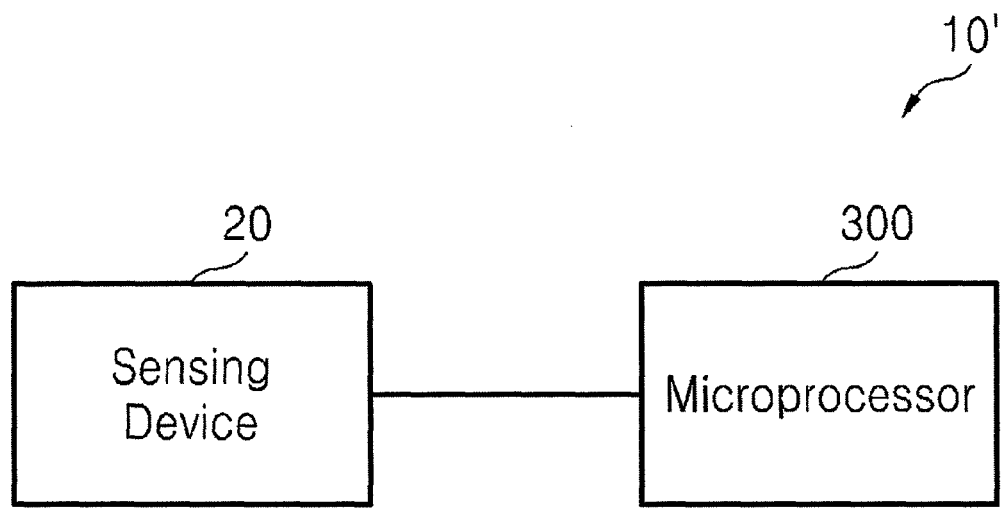
FIG. 14 illustrates a block diagram of a depth measurement system including the depth measurement device illustrated in FIG. 1.

In such embodiments, the logic circuit 34 (see FIG. 1) may convert the first signals, second signals, and third signals into first digital signals, second digital signals, and third digital signals, respectively, and may transmit them to a microprocessor, e.g., 300 of FIG. 14.

For example, the microprocessor may calculate a distance detected by the sensor 200-2, by processing the first digital signals and the second digital signals. In such embodiments, the microprocessor may also calculate a distance detected by a sensor 200-3 by processing the first digital signals and the third digital signals.

Selectively, a third photo gate control signal PG_AS' may be supplied to each first photo gate A of a plurality of sensors 200-1 to 200-8, and a fourth photo gate control signal PG_BS' may be supplied to each second photo gate A of the plurality of sensors 200-1 to 200-8 at the same time.

For example, when a third photo gate control signal PG_AS1 having a high level is supplied to each first photo gate A of a plurality of sensors 200-2 and 200-3, fourth signals generated by each of the plurality of sensors 200-2 and 200-3 may be output through the first data line B11.

When a fourth photo gate control signal PG_BS' having a high level is supplied to each second photo gate B of a plurality of sensors 200-1, 200-2, 200-3 and 200-4, fifth signals generated by each of a plurality of sensors 200-1, 200-2 may be output through the second data line A11, and sixth signals generated by each of a plurality of sensors 200-3, 200-4 may be output through the third data line A12.

The logic circuit 34 may convert fourth signals, fifth signals, and sixth signals into fourth digital signals, fifth digital signals, and sixth digital signals, respectively, and may transmit them to the microprocessor, e.g., 300 of FIG. 14.

More particularly, e.g., the microprocessor may calculate a distance detected by a sensor 200-2 by processing first digital signals, second digital signals, fourth digital signals, and fifth digital signals. The microprocessor may also calculate a distance detected by a sensor 200-3 by processing, e.g., first digital signals, second digital signals, third digital signals, and sixth digital signals.

FIG. 14 illustrates a block diagram of a depth measurement system including the depth measurement device illustrated in FIG. 1.

FIG. 14 shows a block diagram of a distance measurement system 10' including the distance measurement device illustrated in FIG. 1. The distance measurement system 10' may include the semiconductor chip 20 and a microprocessor 300. As discussed above with regard to FIG. 1, the semiconductor chip 20 may include a sensing device, e.g., sensors, e.g., 23, 23'. According to embodiments, the semiconductor chip 20 and the microprocessor 300 may be embodied in a separate chip or a single chip.

The microprocessor 300 may calculate a distance or an image of a target object based on digital signals output from the semiconductor chip 20. The distance measurement system 10' may be used in a three-dimensional distance sensor, a game controller, a depth camera or a gesture sensing apparatus.

Embodiments of a sensor employing one or more features described herein may increase sensitivity of the sensor by increasing a light receiving area of an array relative to comparable conventional devices.

Embodiments of a sensor employing one or more features described herein may include a micro-lens, and may thereby increase an amount of received light.

Embodiments of a sensor employing one or more features described herein may enable a finger length, e.g., horizontal length, of a photo gate to be reduced, which may thereby enable photo charges to be transmitted to a floating diffusion region more rapidly relative to comparable conventional devices, such that a transmission efficiency of a photo charge may be increased.

Embodiments of a sensor employing one or more features described herein may enable accuracy of the sensor to be increased.

Embodiments of a sensor may enable a capacitance thereof to be reduced as a plurality of photo gates may share a same floating diffusion region.

It will be understood that, although the terms first, second, etc. may be used herein to describe various elements, these elements should not be limited by these terms. These teens are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A sensor, comprising:
   a plurality of photo gate pairs on a semiconductor substrate, each of the photo gate pairs defining one sensing unit and including a first photo gate adjacent to a second photo gate;
   a first shared floating diffusion region in the semiconductor substrate, the first shared floating diffusion region being shared by first photo gates of different photo gate pairs;
   a second shared floating diffusion region being electrically separated from the first shared floating diffusion region in the semiconductor substrate, each second shared floating diffusion region being shared by second photo gates of the different photo gate pairs; and
   a plurality of first transmission transistors on the semiconductor substrate,
   wherein each of the plurality of first transmission transistors is adapted to transmit charges to the first shared floating diffusion region in response to a first transmission control signal, the charges being generated in the semiconductor substrate under the first photo gate of each of the plurality of photo gate pairs.

2. The sensor as claimed in claim 1, further including:
   a plurality of second transmission transistors on the semiconductor substrate,
   wherein each of the plurality of second transmission transistors transmits charges to the second shared floating diffusion region in response to a second transmission control signal different from the first transmission control signal, the charges being generated in the semiconductor substrate under the second photo gate of each of the plurality of photo gate pairs.

3. The sensor as claimed in claim 2, further including:
   a first reset transistor adapted to reset the first shared floating diffusion region in response to a reset signal; and
   a second reset transistor adapted to reset the second shared floating diffusion region in response to the reset signal, the first and second shared floating diffusion regions being electrically disconnected from each other.

4. The sensor as claimed in claim 2, further including:
   a first output circuit adapted to output a first electrical signal, generated based on charges transmitted to the first shared floating diffusion region, to a first column line; and
   a second output circuit adapted to output a second electrical signal, generated based on charges transmitted to the second shared floating diffusion region, to a second column line, the first and second shared floating diffusion regions being electrically independent of each other.

5. The sensor as claimed in claim 4, wherein the first output circuit includes:
   a first reset transistor connected between a voltage source and the first shared floating diffusion region, only the first photo gates of all the photo gate pairs being connected to a same first shared floating diffusion region;
   a first driving transistor including a gate connected to the first shared floating diffusion region; and
   a first selection transistor connected between the first driving transistor and the first column line, wherein the second output circuit includes:
   a second reset transistor connected between the voltage source and the second shared floating diffusion region, only the second photo gates of all the photo gate pairs being connected to a same second shared floating diffusion region;
   a second driving transistor including a gate connected to the second shared floating diffusion region; and a second selection transistor connected between the second driving transistor and the second column line.

6. The sensor as claimed in claim 1, wherein all the first and second photo gates of the photo gate pairs are arranged in an alternating array in each row.

7. The sensor as claimed in claim 1, wherein
first and second photo gates of odd numbered photo gate pairs are arranged in an alternating array along a first direction in each row and
first and second photo gates of even numbered photo gate pairs are arranged in an alternating array along a second direction opposite the first direction in each row.

8. The sensor as claimed in claim 1, wherein the sensor is a distance measurement sensor employing a time of flight (TOF) measurement method, the sensor being a CMOS device.

9. The sensor as claimed in claim 1, further including:
a light source;
a driver adapted to generate a modulated clock signal for driving the light source; and
a photo gate controller adapted to supply the modulated clock signal or a first photo gate control signal, having a 90° phase difference from an optical signal output from the light source, to the first photo gate and to supply a second photo gate control signal, having a 180° phase difference from the first photo gate control signal, to the second photo gate.

10. The sensor as claimed in claim 1, further including:
a light source;
a driver adapted to generate a modulated clock signal for driving the light source; and
a photo gate controller adapted to supply the modulated clock signal or a first photo gate control signal, having a same phase as an optical signal output from the light source, to the first photo gate and to supply a second photo gate control signal, having a 180° phase difference from the first photo gate control signal, to the second photo gate.

11. The sensor as claimed in claim 10, wherein the photo gate controller is further adapted to supplying the modulated clock signal or a third photo gate control signal, having a 90° phase difference from the optical signal output from the light source, to the first photo gate and to supply a fourth photo gate control signal, having a 180° phase difference from the third photo gate control signal, to the second photo gate.

12. A method of operating a sensor, comprising:
supplying a first transmission control signal to a plurality of first transmission transistors formed on a semiconductor substrate and supplying a first photo gate control signal to a first photo gate of each of a plurality of photo gate pairs formed on the semiconductor substrate;
supplying a second transmission control signal different than the first transmission control signal to a plurality of second transmission transistors formed on the semiconductor substrate and supplying a second photo gate control signal to a second photo gate of each of the plurality of photo gate pairs, the first and second photo gates of each photo gate pair being adjacent to one another and forming a sensing unit;
transmitting charges, generated in the semiconductor substrate located under the first photo gate of each of the plurality of photo gate pairs, to a first shared floating diffusion region during a same time, the first shared floating diffusion region being shared by all the first photo gates of the plurality of photo gate pairs; and
transmitting charges, generated in the semiconductor substrate located under the second photo gate of each of the plurality of photo gate pairs, to a second shared floating diffusion region being electrically separated from the first shared floating diffusion region during a same time, the second shared floating diffusion region being shared by all the second photo gates of the plurality of photo gate pairs.

13. The method as claimed in claim 12, further including: resetting the first shared floating diffusion region using a reset transistor.

14. The method as claimed in claim 12, wherein a phase difference between the first photo gate control signal and the second photo gate control signal is 180°.

15. The method as claimed in claim 12, further including resetting the first shared floating diffusion region using a first reset transistor and resetting the second shared floating diffusion region using a second reset transistor.

16. A depth measurement device, comprising:
a light source;
a lens module;
a semiconductor device, the semiconductor device, including:
a light source driver;
a logic circuit;
a row decoder;
a photo gate controller;
a timing controller; and
a sensor array, including:
a plurality of photo gate pairs on a semiconductor substrate, each of the photo gate pairs defining one sensing unit and including a first photo gate adjacent to a second photo gate;
a first shared floating diffusion region in the semiconductor substrate, each first shared floating diffusion region being shared by first photo gates of different photo gate pairs;
a second shared floating diffusion region being electrically separated from the first shared floating diffusion region in the semiconductor substrate, each second shared floating diffusion region being shared by second photo gates of the different photo gate pairs; and
a plurality of first transmission transistors on the semiconductor substrate, wherein each of the plurality of first transmission transistors is adapted to transmit charges to the first shared floating diffusion region in response to a first transmission control signal, the charges being generated in the semiconductor substrate under the first photo gate of each of the plurality of photo gate pairs, wherein:
the row decoder is adapted to select one of a plurality of rows or the sensor array based a row address output from the timing controller,
the photo gate controller is adapted to supply photo gate control signals to the sensor array in accordance with the timing controller,
the light source driver is adapted to drive the light source in accordance with the timing controller,
the logic circuit is adapted to process signals sensed by the sensor array in accordance with the timing controller.

17. The device as claimed in claim 16, wherein the lens module includes an infrared pass filter.

18. The sensor as claimed in claim 1, wherein at least one of the photo gate pairs includes comb shaped photo gates arranged in point symmetry.

19. The device as claimed in claim 16, wherein at least one of the photo gate pairs includes comb shaped photo gates arranged in point symmetry.

\* \* \* \* \*